United States Patent [19]

Li et al.

[11] Patent Number: 5,304,255

[45] Date of Patent: Apr. 19, 1994

[54] PHOTOVOLTAIC CELL WITH PHOTOLUMINESCENT PLASMA POLYMERIZED FILM

[75] Inventors: Guifang Li; Jeffrey A. Tobin; Denice D. Denton, all of Madison, Wis.

[73] Assignee: Wisconsin Alumni Research Foundation, Madison, Wis.

[21] Appl. No.: 955

[22] Filed: Jan. 5, 1993

[51] Int. Cl.$^5$ .......................................... H01L 31/055
[52] U.S. Cl. .................................................. 136/257
[58] Field of Search ........................ 136/247, 256–257, 136/259; 250/216, 227.18

[56] References Cited

U.S. PATENT DOCUMENTS 3,426,212  2/1969  Klaas .................................... 250/226

OTHER PUBLICATIONS

H. S. Gurev, *Conference Record, 17th IEEE Photovoltaic Specialists Conference* (1984), pp. 191–195.
R. Reisfeld et al, *Solar Energy Materials*, vol. 17, Oct. 1988, pp. 439–455.
U. Gyllenberg-Gästrin et al, *Proceedings, 6th E.C. Photovoltaic Specialists Conf.*, London, Apr. 1985, pp. 1031–1035.
Wasniewski, T., "Processes of Excitation and Deactivation of Excitation Energy in Organic Wavelength Transformers Cooperating with Solar Photovoltaic Cells," *Applied Optics*, vol. 31, No. 12: 2163–2167 (1992).
Whitehurst, et al., "Sol-gel Glass Solid State Lasers Doped With Organic Molecules," SPIE, vol. 1328 Sol-Gel Optics pp. 183–193 (1990).

*Primary Examiner*—Aaron Weisstuch
*Attorney, Agent, or Firm*—Quarles & Brady

[57] ABSTRACT

Plasma polymerized organic films deposited on a substrate exhibit broad bandwidth photoluminescence after excitation with blue, violet, or ultraviolet light. The photoluminescent properties of such organic films may be exploited by using such films as wavelength transformers for photovoltaic materials, as organic solid-state gain media, as process quality control tools, and as color-correcting coatings for fluorescent lamps.

3 Claims, 3 Drawing Sheets

PHOTOVOLTAIC CELL WITH PHOTOLUMINESCENT PLASMA POLYMERIZED FILM

STATEMENT REGARDING FEDERALLY SPONSORED RESEARCH

This invention was made with U.S. Government support awarded by the National Science Foundation (NSF), Grant No. ECD-8721545. The U.S. Government has certain rights in this invention.

FIELD OF THE INVENTION

The present invention relates to the field of plasma polymerization and thin film deposition and in particular to the exploitation of photoluminescent properties of such films.

BACKGROUND OF THE INVENTION

Plasma polymerization is a technique used for depositing polymer-like organic materials, usually in the form of thin films, onto surfaces in contact with or near a plasma discharge. Unlike conventional polymers, plasma polymers do not consist of long chains of monomeric repeat units with sparse "cross-links" connecting the chains. Instead, they are highly branched, three-dimensional interlinked monomer-derived networks which result from fragmentation and dissociation in the plasma in which the film-forming reactant species are generated. Plasma polymerized films are formed from organic monomers and are in general, pinhole-free, dense and amorphous. When compared with conventional polymer films made from the same monomer(s), plasma polymers exhibit better adhesion, and improved chemical and mechanical resistance. Furthermore, the properties of the deposited films can be changed by varying the deposition parameters.

Plasma polymerized films are formed in an apparatus that typically consists of three parts: (1) a vacuum system, (2) an electrical excitation system for generating a plasma, and (3) a monomer gas delivery system. As monomer molecules flow through the vacuum chamber, the plasma discharge energizes and disassociates the monomer molecules into neutral particles and reactant fragments in the form of electrons, ions and free radicals. As these reactant fragments recombine on a substrate, a highly branched and cross-linked three-dimensional network is formed.

Industrial applications of plasma polymers include surface modifications, barrier coatings, and dielectric-, photoresist-, and waveguiding films for microelectronics and photonics.

The macroscopic properties of plasma polymers are typically very different from those of conventional linear polymers made from the same starting monomer(s). Indices of refraction and mechanical resistance have been the most often characterized macroscopic physical properties of plasma polymers, and they are much different from those of conventional cross-linked linear polymer films, even when made from the same monomer.

Although macroscopic properties are manifestations of microscopic properties, many microscopic physical and chemical properties of plasma polymers have not yet been well characterized. In fact, because of the heterogeneous character of the linkages in the plasma polymer, it is difficult to do such characterizations. One microscopic property which is manifested in macroscopic differences between conventional polymers and plasma polymers is color. The color of many plasma polymers derived from single monomers is yellow, even though the corresponding conventional polymers produced from the same monomer are clear under white-light illumination. The yellow color of plasma polymers such as methyl methacrylate, ethylene, and hexamethyldisiloxane indicates absorption of light in the blue, violet and ultraviolet region of the visible spectrum. Blue-violet absorption is confirmed by ultraviolet-visible-near infrared transmission analysis which reveals appreciable absorption at wavelengths less than 800 nm and markedly increased absorption below 450 nm. Absorption of blue and violet light has heretofore been thought solely responsible for the yellow tint of plasma polymers.

SUMMARY OF THE INVENTION

The present invention is summarized in that it has been found that the yellow color of plasma polymers results also from photoluminescence by plasma polymers in the yellow and green wavelengths. It is believed that unsaturated bonds in plasma polymers forming conjugate-bond chromophores not found in conventional polymers are responsible for the photoluminescence. The photoluminescence of plasma polymer films makes the material appropriate for potential applications such as wavelength transformers for solar cells, as gain media for solid-state organic lasers, as color-correcting coatings in fluorescent lights and as a process quality control tool.

It is an object of the present invention to provide heretofore unrecognized applications for plasma polymerized organic thin films which exploit the films' previously undetected photoluminescent properties.

Other objects, features and advantages will become apparent when considered in light of the following drawings and specification.

DESCRIPTION OF THE PREFERRED EMBODIMENT

The present invention is directed to exploiting the photoluminescent properties of plasma polymerized organic thin films for various applications. Using plasma polymerization techniques, organic thin films are deposited on surfaces or substrates in contact with or near a plasma. The films made by the plasma polymerization process may not be true polymers, in the sense that the word is most often used, i.e. long chains of repeating similar units of a single monomer with sparse "cross-links" connecting the chains. Instead, the monomer molecules are broken apart by the energy of the plasma and the fragments thus created are joined into a unitary film of three-dimensionally interlinked molecules. Plasma polymers deposited on surfaces are highly branched, three-dimensional networks formed from fragmented and disassociated monomers dispersed in the plasma. Also unlike conventional polymers, it is herein disclosed that plasma polymer films excited by blue, violet, and ultraviolet light emit light over a wide range of green-yellow wavelengths. The resulting films are referred to as polymeric films here, since that is the nomenclature used in the field.

In general, the prior art is cognizant of the fact that many organic monomers may be deposited by plasma deposition to create optically transparent thin film materials. While the results described below were obtained using plasma polymerized methyl methacrylate (PPMMA), formed from the monomer methyl methacrylate (MMA), any other suitable organic monomer which may be deposited as a plasma polymer film may be utilized. Other monomers which are known to form similar films include a variety of aliphatic and aromatic organic compounds including ethers, alcohols, halogenated hydrocarbons, ketones and silicones, ethylene, acrylic acid, acetic anhydride, and pyruvic acid.

Figure 1:
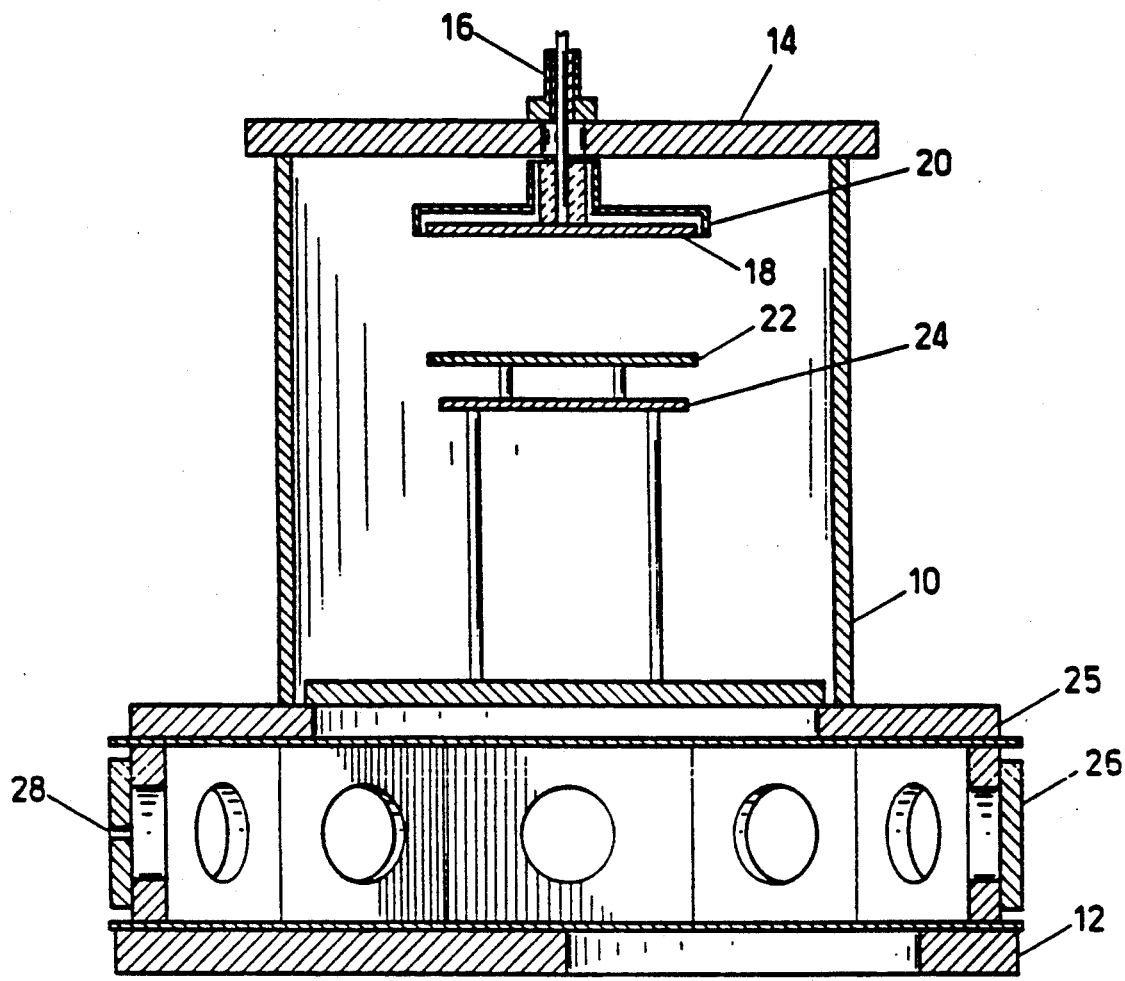
FIG. 1 is a side cross-sectional view of a plasma deposition chamber for forming plasma polymers.

Plasma polymerization requires the use of a plasma chamber which is under a vacuum and is capable of imposing an electric field to excite a gas monomer, to create a plasma and to induce plasma deposition of the gas monomer upon a substrate placed upon one of the electrodes. Many devices useful for depositing plasma polymerized thin films exist. A suitable apparatus used by the inventors for forming plasma polymer thin films including a vacuum system, an electrical excitation system, and a gas delivery system is shown in FIG. 1. The reaction chamber 10 of the apparatus is a cylindrical Pyrex chamber placed ultimately upon a base plate 12. The chamber is sealed by a lid 14, through which a conductor 16 extends connecting to an electrode 18. The electrode 18, in this embodiment, serves as the powered electrode. A ground shield 20 surrounds the powered electrode and is grounded to the case and also to the electrical ground from which the RF power is supplied. Directly below the upper electrode 18 is a lower electrode 22 which serves as the ground electrode. The ground electrode 22 is supported on a mounting bar 24 elevated above an aluminum feed-through flange 25. The feed-through flange 25 is mounted upon a feed-through collar 26, containing a series of ports 28 to which gas fittings may be attached. The feed-through collar 26 rests on the base plate 12, which has a suitable opening in it for connection to one or more vacuum pumps. The seal between the feed-through collar and the base plate 12 is made with an O-ring. The Pyrex cylinder 10 is sealed at both ends with Viton L-gaskets. Below the base a vacuum pump (not shown) is placed which is capable of drawing a vacuum through the vacuum port to the interior of the apparatus 10.

The parallel plate electrodes consisting of the upper electrode 18 and the lower electrode 22 are 6 inch diameter aluminum plates. The upper electrode is capacitively coupled to an RF Plasma Products 1 KW, 13.56 MHZ power supply. The lower electrode is connected to ground The electrodes are spaced approximately 3 inches apart. The impedance of the electrodes was matched with an RF Plasma Products manual matching network. The RF power supply to the electrodes was continuously monitored with a Bird thruline wattmeter (Model Number 4385-832), placed in-line between the power supply and the matching network. Two vacuum pumps are connected through to the interior of the chamber 10.

During the operation of the apparatus used to produce PPMMA films, monomer is fed as a vapor through suitable gas-handling apparatus connected to the aluminum feed-through collar 26. Methyl methacrylate vapor is created from a liquid source (Aldrich 80-62-6). The liquid MMA monomer is heated to develop the desired flow rate of vaporous material into the system. The gas lines are heated to prevent condensation. The flow of the gaseous monomer into the system is controlled with an Applied Materials Model 550 mass flow controller. The pressure in the system is continually monitored with an MKS Baratron Model 127 capacitance manometer.

PPMMA films described below were deposited to a thickness of about 3 $\mu$m on microscope slide coverslip substrates in a plasma polymerization and deposition system under neutral pressure of 300 mT, at 60 W power and a monomer flow rate of 20 sccm.

Plasma polymers produced using the above-described apparatus exhibit a characteristic yellow color which differs from clear conventional polymers. The yellow color results, in part, from blue and violet light absorption. For example, spectrophotometric UV-Vis-NIR transmission analysis of PPMMA film reveals appreciable absorption at wavelengths less than 800 nm and sharply increased absorption below 450 nm. The transmission cutoff is about 350 nm.

Figure 2:
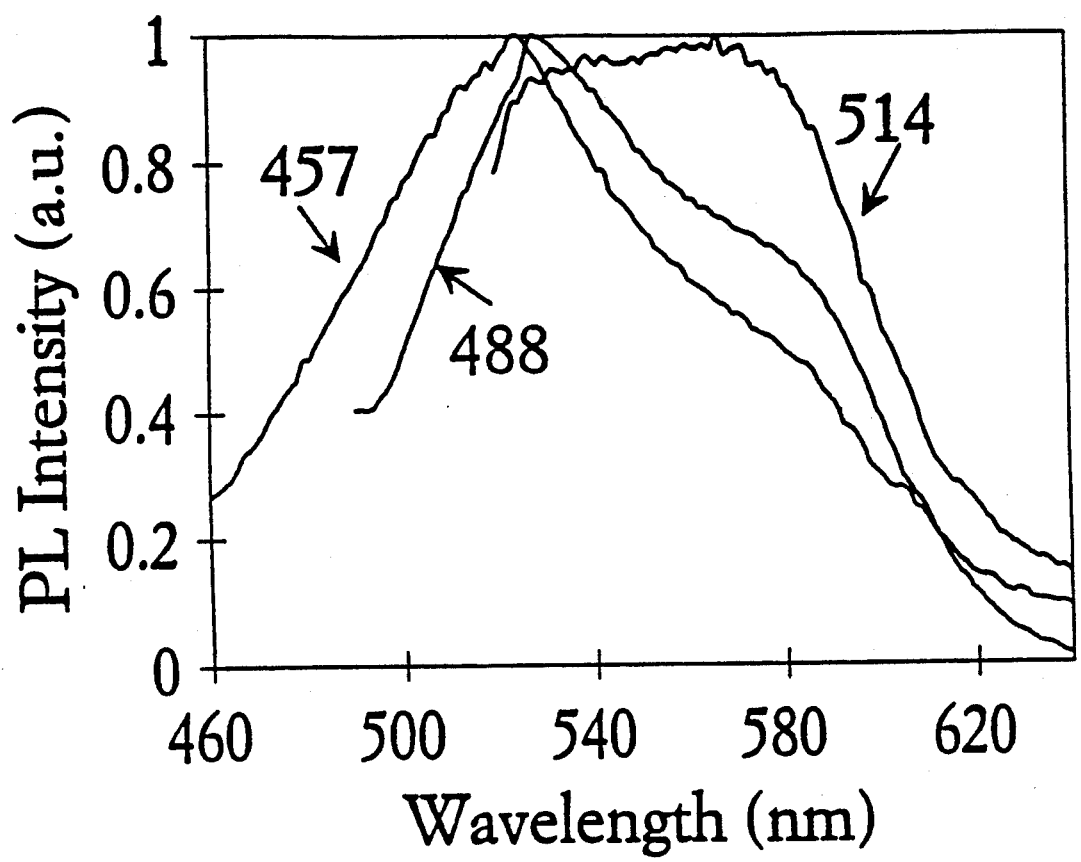
FIG. 2 is a graph of photoluminescence spectra of plasma polymer methyl methacrylate films excited with light at three discrete frequencies.

However, it has not heretofore been known that plasma polymer films excited with blue, violet or ultraviolet light also emit light over a wide wavelength range, which varies with the excitation wavelength. FIG. 2 shows the photoluminescence profile of PPMMA films excited with 457 nm, 488 nm, and 514 nm light from an argon laser. The photoluminescent light emitted from the plasma polymer film was collected with a lens and directed to the entrance of a monochromator where its intensity was detected using a photomultiplier. The intensities shown in the spectra of FIG. 2 are normalized with respect to maximum peak intensity for each spectrum.

The photoluminescence spectrum of PPMMA films, excited using argon laser light at 457 nm or 488 nm, reveals, in FIG. 2, a sharp peak around 525 nm and a secondary broad peak around 560 nm. When the same films are excited using 514 nm laser light, the photoluminescence spectrum is flat at wavelengths shorter than 560 nm and decreases at wavelengths longer than 560 nm. When still shorter wavelengths are used to excite the deposited organic films, photoluminescence is observed over an even broader wavelength range. For example, at 370 nm excitation, the photoluminescence spectrum ranges from 380 nm to 700 nm, centered around 500 nm. (200 nm FWHM). It is believed by the present inventors that the broadband photoluminescence is not caused by vibrational broadening of individual chromophores, but rather by the existence of many chromophores in varied chemical and structural environments.

Figure 3:
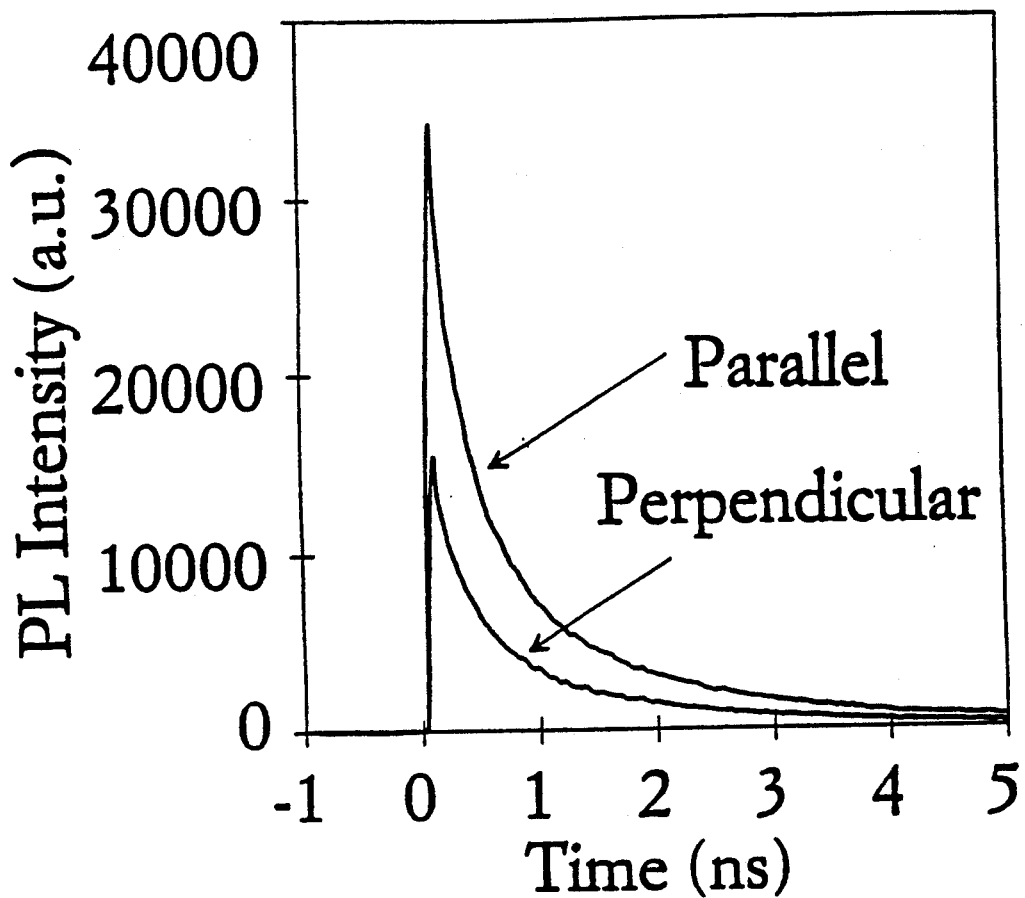
FIG. 3 is a plot of photoluminescent decay of plasma polymer methyl methacrylate film.

Photoluminescence from an excited PPMMA film is fluorescent, rather than phosphorescent, as determined by photoluminescent decay profile. The lifetime of a fluorescent transition is typically on the order of nanoseconds, while that of a phosphorescent transition is on the order of milliseconds. FIG. 3 demonstrates that the photoluminescent decay of PPMMA film excited with light at 380 nm is fluorescent, insofar as it is on the order of nanoseconds in duration, without regard to whether the detection light polarization was parallel or perpendicular to that of the excitation light. Fluorescence originates from a radiative transition from an excited singlet state to the ground state, while phosphorescence originates from a radiative transition from an excited triplet state to the ground state.

The photoluminescent spectra of plasma polymer films are also, in general, independent of the excitation light intensity. Furthermore, the functional groups responsible for the photoluminescence are present throughout the film rather than merely at its surface. As such, thicker plasma polymer films photoluminesce at higher intensity than thinner films of the same composition when both are excited with excitation light of the same intensity.

It is hypothesized by the present inventors that the arrangement of the functional groups of plasma polymers, rather than the composition itself, is responsible for the fluorescence, which is not observed in conventional polymers or monomers. PPMMA films are composed of the same functional groups as both the MMA monomer and the conventional polymer PMMA, neither of which is photoluminescent. However, in PPMMA films, the functional groups are rearranged randomly, resulting in a higher carbon:oxygen ration in PPMMA films than in conventional PMMA, as determined by Grazing-incidence Fourier transform infrared (FT-IR) spectroscopy and Electron Spectroscopy for Chemical Analysis (ESCA). The decrease in relative oxygen concentration in PPMMA film is linked with an increase in unsaturated carbon relative to that in the conventional polymer. It is suspected that some of the unsaturated carbon-oxygen bonds in PPMMA may be able to form conjugate-bond chromophores which can luminesce like the chromophores present in laser dyes. These conjugate-bond chromophores are likely to be present in many different chemical and structural environments, permitting broadband photoluminescence and non-exponential fluorescence decay. It is believed that preferred monomers useful for forming photoluminescent films are those formed principally only of carbon, hydrogen, and oxygen, which more efficiently form conjugate bond systems believed responsible for the photoluminescence.

The ability of plasma polymer films to absorb light in the blue, violet, and ultraviolet wavelengths, and to re-radiate light in the green and yellow wavelengths, make these films well suited for use as wavelength transformers and as light sources. Their utility as wavelength transformers may be demonstrated with respect to photovoltaic materials, such as silicon solar cells. Existing photovoltaic materials are most absorptive of green and yellow light. Therefore, only the green and yellow portions of the sunlight spectrum are convertible into electricity. In fact, one of the inherent inefficiencies of photovoltaic materials arises from the fact that they only can absorb light in a portion of the visible light spectrum. Accordingly, it is desirable to provide such materials with as much green and yellow light as possible to increase photovoltaic efficiency. By harnessing the blue, violet, and ultraviolet portions of the sunlight spectrum and converting those wavelengths to yellow and green wavelengths, the amount of electricity that could be produced from a fixed exposure to sunlight would increase. To provide additional, green-yellow light to a photovoltaic cell, a layer of photoluminescent plasma polymerized organic film can be deposited or interposed in the path of light rays passing into the cell, such that the light rays must first pass through the film. The plasma polymerized film will thus increase the total amount of absorbable light incipient on the photovoltaic material by converting some of the blue and violet light to yellow-green.

Foils composed of PMMA (not plasma polymerized) laced with luminescent substances, such as Rhodamine-6G dye, have been coated onto photovoltaic cells and have demonstrated that is possible to enhance the efficiency of such cells by shifting the input wavelengths to wavelengths more useful to the cells. However, such dye-lacing techniques are hampered by the rapid dissociation of the photoluminescent material.

In contrast, a wavelength-transforming window formed of a plasma polymer such as PPMMA placed atop an existing solar cell receptor will enhance the conversion of sunlight to electricity by photonic conversion of blue, violet, and ultraviolet light into green and yellow light without the inherent difficulties or instabilities associated with dyes. Because the photoluminescence is integral to the plasma polymer, it can withstand long solar exposure.

For many of the same reasons, photoluminescent plasma polymer films may also be useful as gain media in solid-state dye lasers. Existing solid-state dye lasers use dye-doped polymer matrices as gain media. Dye-doped gain media excited by an energy source permit the amplification of light within a lasing chamber. However, dyes currently used in solid-state dye-doped gain media have proven inadequate since they tend to dissociate after relatively short exposure to high energy pumping and since they cannot be tuned over a broad range of desired output wavelengths due to narrow photoluminescence bandwidths. In contrast, pumping of photoluminescent plasma polymer films with blue, violet, or ultraviolet light should enhance the amplification of yellow and green light over a relatively wide bandwidth, as was shown in FIG. 2. The wide photoluminescent bandwidth would increase the tunability of lasers employing plasma polymer films as gain media.

An additional use for photoluminescent plasma polymer organic thin films is as a coating on or within fluorescent lamps. The phosphor coatings now used inside the lamps emit white light when excited by UV light. However, fluorescent light is often perceived as "too blue." By using blue-green-absorbing plasma polymer thin films as supplemental coatings, not only would less blue wavelength light be emitted, but additional yellow-green light would be put forth, as a result of the wavelength shifting characteristic of the plasma polymeric organic thin films.

The photoluminescent properties of plasma polymerized films may also be utilized to monitor the quality of films used in industrial coating processes. Plasma polymerized thin film coatings are used, for example, to provide a durable, scratch-proof surface to eyeglass lenses and other optical products. Also, such films provide oxygen-tight coatings to packaged foods, thereby prolonging shelf life. During the quality control portion of a manufacturing process, exposure of a surface believed to be coated to blue, violet, or ultraviolet light followed by monitoring for the presence of yellow or green photoluminescence can provide a test for successful coating formation. Since the monomers used to make plasma polymerized thin films do not themselves photoluminesce, an absence of photoluminescence indicates that the protective coating is not properly formed.

Thus, the plasma polymerized coatings or films seem generally adapted for a variety of wavelength transformation applications. In any application in which additional green and yellow light frequencies are desired, photoluminescent plasma polymerized films can be used to decrease the incident level of blue and violet light and to increase the amount of green and yellow. The films can simply be interposed in the path of light flow to achieve this effect. Since the films can be deposited on a variety of substrates, any desired optical element can be converted to this wavelength transformer function by coating with such a plasma film.

The present invention is understood not to be limited to the particular embodiments discussed above, but embraces all such variations and modifications thereof as come within the scope of the following claims.

We claim:

1. A photovoltaic cell having interposed in its light path a wavelength-transformer comprising a photoluminescent plasma polymerized organic film which transforms blue, violet, and ultraviolet light rays into green and yellow light rays.

2. A photovoltaic cell as claimed in claim 1 wherein the plasma polymerized organic film is formed from a monomer consisting of carbon, hydrogen, and oxygen.

3. A photovoltaic cell as claimed in claim 2 wherein the plasma polymerized organic film is plasma polymerized methyl methacrylate film.

* * * * *